(12) United States Patent
Hong (10) Patent No.: US 8,116,047 B2
(45) Date of Patent: Feb. 14, 2012

(54) ELECTROSTATIC DISCHARGE PROTECTIVE CIRCUIT HAVING RISE TIME DETECTOR AND DISCHARGE SUSTAINING CIRCUITRY

(75) Inventor: Richard J. K. Hong, Sunnyvale, CA (US)

(73) Assignee: SanDisk Technologies Inc., Plano, TX (US)

( * ) Notice: Subject to any disclaimer, the term of this patent is extended or adjusted under 35 U.S.C. 154(b) by 553 days.

(21) Appl. No.: 12/338,056

(22) Filed: Dec. 18, 2008

(65) Prior Publication Data

US 2010/0157491 A1    Jun. 24, 2010

(51) Int. Cl.
*H02H 3/20* (2006.01)
*H02H 9/04* (2006.01)

(52) U.S. Cl. ......... 361/56; 361/111; 361/91.1; 361/91.5
(58) Field of Classification Search ............... 361/56, 361/111, 91.1, 91.5
See application file for complete search history.

(56) References Cited

U.S. PATENT DOCUMENTS

| 5,686,751 | A | 11/1997 | Wu |
| 5,946,177 | A * | 8/1999 | Miller et al. ............... 361/56 |
| 7,209,332 | B2 * | 4/2007 | Stockinger et al. ......... 361/56 |
| 7,453,676 | B2 | 11/2008 | Huh |
| 2004/0109270 | A1 | 6/2004 | Stockinger et al. |
| 2006/0176626 | A1 | 8/2006 | Griesbach et al. |
| 2007/0285854 | A1 | 12/2007 | Rodgers et al. |
| 2008/0007882 | A1 | 1/2008 | Bernard et al. |

OTHER PUBLICATIONS

Croft, Gregg D., "*Transient Supply Clamp with a Variable RC Time Constant*," Electrical Overstress/Electrostatic Discharge Symposium, 1996. Proceedings, Sep. 10-12, 1996, pp. 276-279.
International Search Report dated Mar. 22, 2010 from International Application No. PCT/US2009/067390.
Written Opinion dated Mar. 22, 2010 from International Application No. PCT/US2009/067390.

* cited by examiner

*Primary Examiner* — Rexford Barnie
*Assistant Examiner* — Zeev V Kitov
(74) *Attorney, Agent, or Firm* — Beyer Law Group LLP (57) ABSTRACT

Methods and devices of the invention include an electrostatic discharge (ESD) protection circuit. This circuit includes rise time dependent activation circuitry capable of detecting a slew rate of an input signal and capable of determining whether the slew rate of the input signal is greater than a threshold value. For an ESD event said activation circuitry generates a trigger signal. Additionally, the activation circuitry is coupled with the ESD dissipation duration control circuitry which is further coupled with an ESD dissipation circuit. This arrangement enabling the duration control circuit to be activated by the trigger signal which responds by producing an activation signal that activates the ESD dissipation circuitry and that controls the length of time the dissipation circuit remains active. The ESD dissipation circuitry includes a shunt that redirects the ESD energy away from the protected internal circuit. The ESD dissipation duration circuitry further configured to maintain shunting of the energy for a period of time sufficient to discharge of the ESD energy without damaging the protected circuitry.

14 Claims, 6 Drawing Sheets

Fig. 5

ELECTROSTATIC DISCHARGE PROTECTIVE CIRCUIT HAVING RISE TIME DETECTOR AND DISCHARGE SUSTAINING CIRCUITRY

TECHNICAL FIELD

This invention relates to integrated circuits and, more particularly, to circuitry for protecting integrated circuit components from damage caused by high slew rate, overvoltage and/or excessive current conditions, such as those caused by electrostatic discharge.

BACKGROUND

The following descriptions and examples are given as background only.

Integrated circuits are susceptible to damage from application of excessive electrical charge, such as those generated during electrostatic discharge (ESD) events. For example, integrated circuits (ICs) may be exposed to electrostatic charges during manufacturing of the integrated circuit (wafer level), handling of the integrated circuit after packaging and/or handling of a printed circuit board after assembly. In some cases, an integrated circuit may be exposed to the charges that arise from the use of plasma etching techniques or other fabrication processes that produce charged particles. In other cases, a packaged integrated circuit may be exposed to electrostatic charges when a person inadvertently touches the exposed pins on the circuit package, or when the package becomes electro-statically charged due to movement of the package across an electrically-conductive surface.

The electrical pulse transferred to an integrated circuit (IC) during an ESD event can inflict significant damage to sensitive components of the integrated circuit. For example, transistors and other electrical devices on an integrated circuit may be damaged when an excessive amount of charge is transferred between one or more pins of the integrated circuit and another conducting object over a short time period, usually between tens and hundreds of nanoseconds. The transferred charge (referred to as electrostatic discharge) can develop voltages that are large enough to break down insulating films on the circuit (such as gate oxides), or dissipate sufficient energy to cause electro-thermal failures in the circuit (such as contact spiking, silicon melting and metal interconnect melting).

Accordingly, others have attempted develop methods to protect integrated circuits, with particular attention to the problem of protecting field effect transistor (FET) devices and other sensitive circuitry from ESD events. In some cases, ESD protection devices are connected between the input/output (I/O) pads and internal circuitry of an IC to redirect the energy generated during an ESD event away from the sensitive circuitry. Protection devices may also be connected to power supply pads or between power supply buses to prevent damage during ESD events. So far these devices have been unable to fully solve existing and constantly evolving ESD problems. Existing devices can be overly sensitive to initial normal power up conditions, mistakenly redirecting normal power up voltages to ground and generating unnecessary and undesirable voltage spiking in the IC. Such "false positives" are highly undesirable and interfere with the normal function of the internal circuitry. In attempting to correct this oversensitivity to "false positives" and other normal power conditions, others have attempted to build protection circuits that are sensitive enough to distinguish normal power up from ESD events. Known circuits of this type frequently do not stay active long enough to sufficiently discharge the ESD event. Thus, the residual undischarged ESD energy is quite capable of overloading and damaging the protected circuitry.

In one prior art approach, an ESD protection device uses a "snapback devices," or devices which rely on parasitic bipolar devices, including bipolar junction transistors (BJTs) and thyristors which are inherent in most semiconductor integrated circuits. These bipolar devices can include those devices normally considered parasitic devices in technologies that use field effect transistors (FET) such as complementary metal-oxide-semiconductor (CMOS) based integrated circuits. During an ESD event, the bipolar device can enter a conductive state to safely dissipate the ESD discharge. Although such snapback devices are often used within ESD protection devices, they are not without disadvantages. For example, it is hard to predict/control the behavior of actual snapback devices fabricated in silicon, since the behavior of their parasitic BJTs cannot be accurately simulated (due to the fact that snapback devices operate in a region (the snapback region) which is largely unmodeled) and their parameters can be difficult to control in an actual implementation. This lack of predictability can lead to inferior ESD protection performance or over-designed networks or both. Consequently, such ESD protection schemes can consume relatively large amounts of silicon area and can affect the stand-by current budgets of the chips they are used in.

In other attempts to solve these problems, active shunt networks (otherwise referred to as "actively switched networks" or "rail-based networks") are used to implement ESD protection. Within such networks, the ESD voltage is conducted through an actively switched network. Such circuits are intended to differentiate between normal operation of the integrated circuit and an ESD event. Advantageously, such active networks can be simulated using conventional circuit simulators, resulting in more predictable protection from ESD discharges, which can take comparatively less area for the same ESD performance. However, active network circuits suffer from some serious limitations and can fail provide adequate ESD protection in all cases. As with snapback devices, the behavior of active network circuitry is also hard to control over process variations. Process variations within many of the circuit components may influence the operation of the trigger circuit by shifting the respective ESD activation conditions to a substantially higher or lower level. In some cases, the active network circuits may fail to protect the internal circuitry from a true ESD event due to process variations that affect the ESD protection circuitry operating parameters. Such failure may allow a potentially damaging electrostatic charge to be supplied to the internal circuitry of an integrated circuit. Typically, the sensitivity of these networks can be adjusted using experimental data. For example, the ESD event sensitivity of a particular active network circuit design may be tested after the respective integrated circuit had been fabricated. If the active network circuit fails to completely discharge an ESD event, the process parameters of the ESD protection circuit are typically altered in order to obtain the desired ESD performance. Once the appropriate changes are made, the integrated circuit may be taped-out again and the ESD protection may be re-verified in the lab once the circuit is fabricated. The process may then continue by trial-and-error until the active network circuit is provided with sufficient sensitivity to detect ESD events (i.e., the ESD protection provided to the integrated circuit meets certain ESD requirements). Unfortunately, such a process is time consuming and costly. In addition, the ESD circuits resulting from such a process cannot be reused for other chips (e.g., with different sizes and/or ESD requirements). Accordingly, customized circuits must be designed and tested for each new circuit.

Other known solutions include simple circuits that have a single RC time constant that is varied depending on the manufacturer and design requirements. In the prior art, ESD circuitry having short RC time constants are employed. Although such circuits are sensitive to ESD events they suffer from an inability to sufficiently discharge ESD events and so do not provide the desired level of ESD protection. ESD protection circuits employing longer RC time constants feature improved discharge capability, but suffer from the inability to effectively distinguish ordinary operational and systemic noise from actual ESD events thereby seriously limiting their usefulness.

Additionally, programmable ESD protection circuits have also been invented. However, these circuits are large, complicated, and require programming time that can substantially increase the cost.

Accordingly, there is a need for improved ESD protection circuitry.

SUMMARY OF THE INVENTION

In accordance with the principles of the present invention, ESD protection devices and methodologies are disclosed.

An electrostatic discharge (ESD) protection circuit embodiment includes a first RC circuit associated with a first RC time constant. The circuit being connected to a first voltage rail to produce a first RC based triggering signal in response to an electrostatic discharge on the first rail. The ESD circuit also has a shunt configured to shunt ESD energy away from a protected circuit when activated. The embodiment also includes a second RC circuit to produce a second RC based activation signal. The second circuit coupled with the first RC circuit and the shunt circuitry and configured so that the circuit operates as a duration control circuit. Accordingly, it produces the activation signal in response to the triggering signal received from the first RC circuit. The activation signal activates the shunt circuit and maintains the shunt in an active state for an extended period of time associated with a second RC time constant of the second RC circuit. The second RC time constant is substantially longer than the first RC time constant. Some associated embodiments can achieve the desired performance without added latch circuitry.

In another embodiment, an electrostatic discharge (ESD) protection circuit includes rise time dependent activation circuitry for detecting a slew rate of an input signal supplied at an input pin capable of determining whether the slew rate of the input signal is greater than a first threshold value. Where the input signal is an ESD event the activation circuitry generates a trigger signal. The activation circuitry is coupled with the ESD dissipation duration control circuitry which is also coupled with an ESD dissipation circuit enabling the duration control circuit to be activated in response to the trigger signal. The duration control circuitry produces an activation signal that activates the ESD dissipation circuitry and that controls the length of time the dissipation circuitry remains active causing the dissipation circuit to remain active long enough to enable sufficient discharge of the input signal. The ESD dissipation circuitry, coupled to the duration control circuitry, activates a shunt in the dissipation circuitry in response to the activation signal thereby shunting the energy associated with the ESD event away from a protected internal circuit. The ESD dissipation duration circuitry further configured to maintain shunting of the energy associated with the ESD event respond to the activation signal for until a sufficient amount of the energy is shunted away from the internal circuit thereby protecting the internal circuit from the ESD event.

Other embodiments include devices having rise time dependent activation circuitry with detector circuitry and trigger circuitry. Such detector circuitry is coupled with the input pin and configured to detect a slew rate of an input signal and determine whether it has a slew rate greater than a first threshold value. For such a signal, the detector treats this as an ESD event and generates an actuation signal. The trigger circuitry being coupled with the detector circuitry, responds to the actuation signal by generating the trigger signal which is received by the ESD dissipation duration control circuitry which then activates and sustains the ESD dissipation circuitry to discharge the event.

Other embodiments of the device are configured so that the rise time dependent activation circuitry has a small RC time constant enabling generation of the trigger signal for high slew rate input signals. And ESD dissipation duration control circuitry configured to extend the dissipation period beyond that dictated by RC time constant of the activation circuitry. Accordingly, in some embodiments the RC time constant of ESD dissipation duration control circuitry is greater than that of the activation circuitry. In some embodiments, the trigger signal is configured to respond to input signals having slew rates in excess of 50 mV/ns (millivolts per nanosecond). In another embodiment, the ESD dissipation duration control circuitry maintains the dissipation circuit in an active mode until the input signal is discharged to a voltage level of about 1.5 times the ordinary operational power up input into the internal circuit. Also, embodiments of the device can further employ latch circuitry in the ESD dissipation duration control circuitry.

In another embodiment, The ESD protection circuit is integrated into an integrated circuit package comprising a substrate having a power pin, ESD protection circuit, and internal circuit. The power pin is coupled with internal circuitry of the device and coupled with the ESD protection circuit such that the ESD protection circuit is activated when an input signal applied to the input pin comprises an ESD event.

In another embodiment, an IC device includes an input pin coupled with an internal circuit and an electrostatic discharge (ESD) circuit arranged to protect the internal circuit from excessive voltage spikes applied at the input pin. Such an ESD circuit comprises trigger circuitry and shunt circuitry. The trigger having a small RC time constant. The trigger configured to activate the shunt when an input signal exceeds a threshold value for slew rate. The shunt circuitry, when activated by the trigger redirects the input signal away from the internal circuitry. The ESD circuit further includes shunt duration circuitry configured to maintain the shunt in an activated condition beyond that specified by the RC time constant of the trigger circuitry thereby enabling the shunt circuitry to discharge an ESD event to an extent that it will not damage the internal circuitry.

In another embodiment the shunt duration circuitry includes latch circuitry that increases the stability of the ESD protection circuit in noisy environment and other voltage variations inherent in the ordinary operation of the protected circuitry. An embodiment can be configured so that the trigger activates the shunt when an electrostatic discharge event occurs at the power input pin but does not activate the shunt when the input signal is an intended input signal. IC device embodiments can be configured so that the shunt duration circuitry maintains the shunt in an activated condition until the voltage from the input signal is less than about 1.5 times the normal operating voltage of the internal circuitry.

In a method embodiment of the invention electrostatic discharge protection is provided by receiving an input signal at an input pin and determining whether the input signal has a slew rate that exceeds a threshold slew rate value. An input signal having a slew rate in excess of the threshold value is defined as an electrostatic discharge (ESD) event. A trigger signal is generated in response to the ESD event a shunt is activated in response to the trigger signal. The activated shunt redirecting the input signal away from the internal circuit. The being maintained in an activated state until the ESD event has been discharged.

In another embodiment, the method of determining and defining whether the input signal comprises an ESD event involves determining whether the input signal exceeds the threshold slew rate associated with a first RC time constant. Responsive to such ESD event, a trigger signal is generated and also the shunt is maintained in an activated state in accordance with a second RC time constant until the ESD event has been discharged. Said embodiments can be configured so that the first RC time constant is responsive to input signals having a slew rate greater than a standard power up slew rate for the device. Examples of suitable slew rates are those greater than about 50 mV/ns Of course this is merely one example and greater slew rate thresholds can also be used. In such embodiments, the shunt can be maintaining in an activated state until the voltage remaining from the ESD event is less than about 1.5 times the ordinary operating voltage of the internal circuitry.

These and other aspects of the present invention are described in greater detail in the following detailed description set forth hereinbelow.

BRIEF DESCRIPTION OF THE DRAWINGS

The following detailed description will be more readily understood in conjunction with the accompanying drawings, in which.

It is to be understood that, in the drawings, like reference numerals designate like structural elements. Also, it is understood that the depictions in the Figures are not necessarily to scale.

DETAILED DESCRIPTION

The present invention has been particularly shown and described with respect to certain embodiments and specific features thereof. The embodiments set forth herein below are to be taken as illustrative rather than limiting. It should be readily apparent to those of ordinary skill in the art that various changes and modifications in form and detail may be made without departing from the spirit and scope of the invention.

The following detailed description describes various embodiments of an ESD protection device and methods for its use. In particular, embodiments of the present invention are configured to rapidly respond to ESD events having a very high slew rate and maintain circuit protection for an extended period of time enabling very high voltages to be sufficiently redirected away from the protected circuitry.

Although the resistance of an ESD event depends much on the precise circuitry being protected, the terms "excessive voltage", "excessive voltage", "ESD energy", "ESD charge", "ESD voltage", all generally describe an "ESD event". Such ESD events are loosely described as a short pulse of voltage that is large enough to inflict damage to the sensitive circuitry requiring ESD protection.

Figure 1:
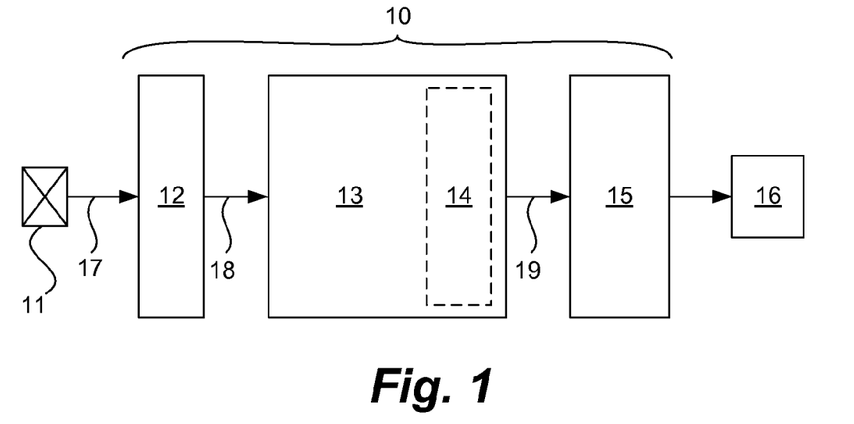
FIG. 1 is a functional block diagram showing the functional components of an ESD protection circuit in accordance with the principles of the invention.

FIG. 1 depicts a block diagram of one embodiment of the invention. A device embodiment of the invention includes and internal circuitry 16 operatively coupled with an input pin 11. Internal circuitry 16 comprises the circuit to be protected from an electrostatic discharge event ("ESD event") to prevent ESD damage. The pin 11 is a conductive contact such as a bond pad or other conductive structure. For example, the pin can be configured for connection with a positive power supply (VDD) 29 or other external inputs. The ESD protection circuit 10 is operatively coupled between the pin 11 and the internal circuitry 16.

The ESD protection circuit 10 (12, 13, 15, and optionally 14) depicted here includes a rise time dependent activation circuit 12 configured to receive an input signal 17 from the pin 11. The activation circuit 12 is configured to differentiate between a non-ESD event and an actual ESD event. For an input signal 17 comprising an ESD event, the activation circuit 12 produces a trigger signal 18 in response to the ESD event. The trigger signal 18 can be transmitted to an ESD dissipation duration control circuitry 13 which can be configured to maintain an associated ESD dissipation circuit 15 in an active state for an extended period of time (generally, 500 ns or more) enabling the ESD event to be discharged without damaging the internal circuitry 16. The applicants point out that the ESD dissipation duration control circuitry 13 can be supplemented with an optional latch circuit 14 which can enhance the circuits 10 stability in the face of noise conditions generated under ordinary operating conditions. Such latch circuitry 14 can be advantageous in some configurations but is not necessarily required to practice the invention. When activated, the ESD dissipation duration control circuitry 13 generates and sustains an activation signal 19 which is received by the ESD dissipation circuitry 15. In response, the ESD dissipation circuitry 15 shunts the energy of the ESD event away from the internal circuitry 16. Typically the ESD event is discharged to a negative power supply $V_{SS}$ or a ground. This depicted embodiment is illustrative rather than limiting and other configurations are possible.

Ordinary simple ESD protection circuits include only the rise time dependent activation circuitry (or trigger circuitry) coupled to a shunt. When such prior art circuits have a short RC time constant they are very sensitive to ESD events and are not generally troubled by "false positives" (i.e., triggering when non-ESD events have occurred), but due to the short time constants they are unable to hold the shunt circuit open long enough to discharge the ESD energy. Other longer RC time constant circuitry has proven excessively sensitive to non-ESD noise events and simple voltage spikes inherent in normal circuit operation. Because, of these problems there is a need for improved ESD circuitry.

Design requirements are require ESD protection circuits having ever increasing resistance to ESD events. This requirement is increasingly problematic as the ESD voltage levels rise. This is particularly problematic for very large ESD events. For example, one such event can correspond to a Human Body Model of an ESD event. In one example describing a HBM ESD event, the ESD current can amount to 3.33 Amps (A), associated with 5000 volts (v) on a 100 pF capacitor discharged through a 1500 Ohm resistor. Such currents and voltages may well be sufficient to inflict serious damage upon field effect transistors (and other circuit elements) of the internal circuitry. Voltages this high are very troublesome for existing ESD protection technologies. The inventors propose, among other things, an embodiment of an ESD protection circuit that is selectively responsive to ESD events and has an extended dissipation period enabling the ESD event to be harmlessly discharged without damaging the internal circuitry. For example, embodiments of the invention can be constructed to maintain a shunt active for at least 500 ns.

Figure 2A:
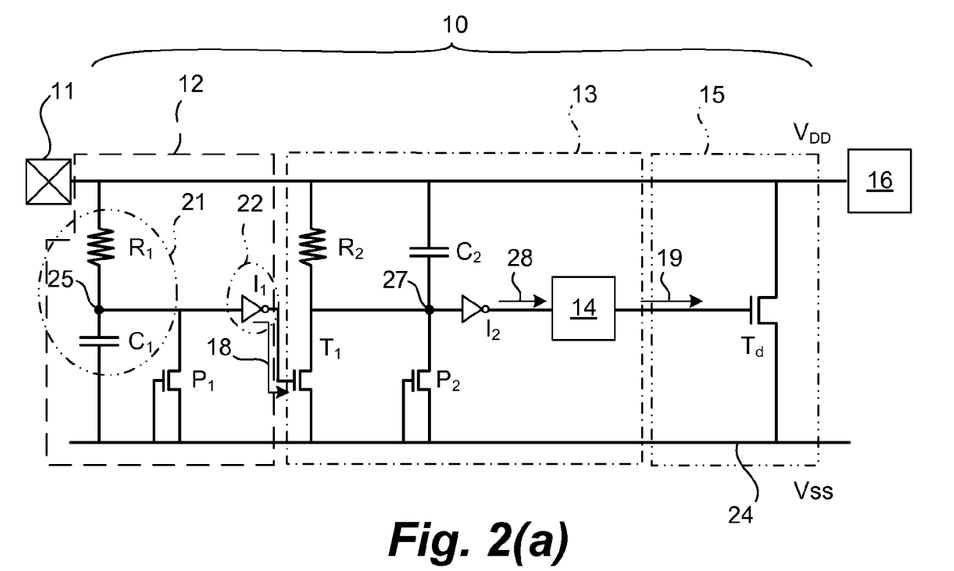
FIG. 2(a) is more detailed schematic depiction of an ESD protection circuit in accordance with the principles of the invention.

In one specific implementation, FIG. 2(a) depicts selected details of one particular embodiment of and ESD circuit constructed in accordance with the principles of the invention.

First, the ESD protection circuit includes rise time dependent activation circuitry 12 (shown in the dashed line). This circuitry is configured with a very short RC time constant. In one implementation, the time constant can be configured to 40 nanoseconds (ns) or less. Accordingly, the circuit 12 is capable of responding rapidly to ESD events with good selectivity between actual ESD events and voltage variations due to ordinary circuit operation. In particular, this circuit can distinguish between an ordinary ramp up voltage and an ESD event.

In one embodiment, the rise time dependent activation circuitry 12 is configured with an RC circuit arranged as a slew rate detector 21. The detector 21 is coupled with the input pin 11 (and the $V_{DD}$ rail) and with trigger circuitry 22. In some embodiments the slew rate detector 21 comprises at least one, but typically a plurality of resistors $R_1$ (or other resistive elements) arranged in series with an associated capacitor(s) $C_1$ (or other capacitive circuit elements). The detector circuitry arranged configured to detect a slew rate of the input signal at the input pin, when the slew rate of the input signal is greater than a first threshold value, then the detector identifies the input signal as an ESD event. In one example, the slew rate detected is greater than the slew rate for the ordinary power ramp-up for the system. In one example system, a particularly useful threshold value at or greater than 50 millivolts per nanosecond (mV/ns). Other embodiments can apply different threshold values depending, for example, at the ramp-up slew rate. Thus, the voltage at node 25 is input into trigger circuitry 22 (commonly comprising an inverter circuit e.g., $I_1$) as an actuation signal.

Depending on the type of event that occurs at pin 11, the output 18 of inverter circuit $I_1$ can vary. However, it is noted that $R_1C_1$ has a very short time constant. Accordingly a "high" signal 18 closely follows the voltage at the pin 11 and is of a very short duration. This short "high" signal 18 switches $T_1$ on which initiates the operation of dissipation duration circuitry 13 and due to the short RC constant of 21 shortly thereafter the signal 18 drops off. In some embodiments of the invention, the inverter $I_1$ has a switching voltage of in the range of 25-50% of the $V_{dd}$ voltage. So for a 3V system a suitable switching voltage is in the range of about 1-1.5V. Similarly, for a 5V system, ranges for a switching threshold is about 1.5-2.5 V.

In the next stage of the ESD protection circuit 10 is dissipation duration control circuitry 13. The duration control circuitry 13 includes a transistor circuit $T_1$ (e.g., IGFET, MOSFET, etc) coupled with the inverter $I_1$ of the rise time dependent activation circuitry 12. The transistor $T_1$ is operatively coupled with a set capacitive element(s) $C_2$ and a resistive element(s) $R_2$ arranged in parallel. And also coupled with an inverter $I_2$. The output of the inverter $I_2$ is either input directly into dissipation circuitry 15 or into an optional latch that is then coupled with the dissipation circuitry 15.

In further detail, node 27 is arranged between the parallel capacitor $C_2$ and resistor $R_2$ and a second inverter $I_2$. The operation of this inverter $I_2$ selectively generates activation signal 19, which, in some cases can last for an extended time period (e.g., 500 ns or longer). This extended period is due to the longer time constant of 13. As a consequence, the inverter $I_2$ output 28 (and in simplest case 19) can turn the shunting transistor $T_d$ on for an extended time period (e.g., sufficient to discharge the ESD energy). It is worth pointing out that the RC time constant $\tau_2$ of the ESD dissipation duration control circuitry 13 is much greater than the RC time constant $\tau_1$ of the rise time dependent activation circuitry 12. This enables the activation signal 19 to have a much longer duration which extends the period of time the dissipation circuitry 15 remains open. This creates a longer dissipation period enabling the dissipation circuitry 15 to shunt or redirect the ESD energy away from the protected internal circuitry 16. In a typical example, $\tau_2$ is typically about twelve times greater than $\tau_1$ and can be much longer depending on the ESD protection needs of the internal circuitry 16 and the nature of the expected ESD events likely to be encountered. In one typical example, $\tau_1$ is about 40 ns or less and $\tau_2$ is about 500 ns or more (in the range of about 500 ns to 2 microseconds (μs) is typical). Thus, ESD protection circuits having $\tau_2/\tau_1$ ratios of greater than 12, 15, 20, or even greater, have utility in accordance with the principles of the invention.

A more detailed explanation of an example mode of operation of one such circuit is illustrated with reference to FIGS. 3(a), 3(b), and FIG. 2(a).

Figure 3A:
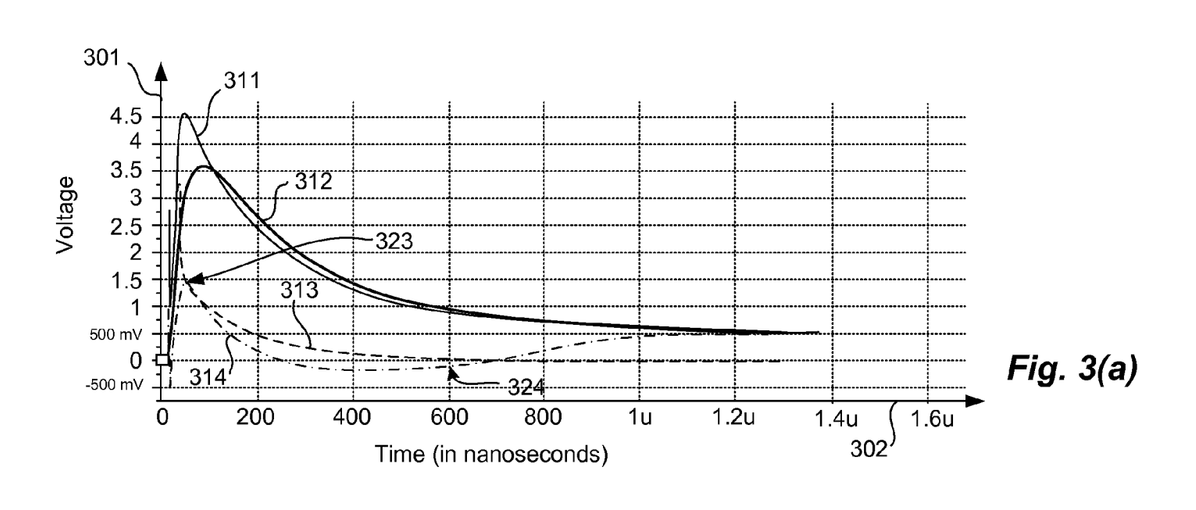
FIGS. 3(a)-3(c) are graphical depictions of a circuit behavior of one example ESD protection circuit constructed in accordance with the principles of the invention to include circuit behavior under ESD event conditions and standard power up conditions.

FIG. 3(a) is graph that maps voltage at selected points of the depicted circuit as a function of time. In this depiction, the voltages are associated with an ESD event. For example, the depicted discharge is a human body model (HBM) discharge. Embodiments of the invention are particularly well suited to discharging this type of ESD event. The vertical axis 301 is demarcated in volts (V) and the horizontal axis 302 is represents time (t) in nanoseconds (ns). The ESD event at pin 11 is depicted as the time varying voltage curve 311. For example, this can be an 8000 volt (8 kV) (or other) ESD event, applied external to the package although the ESD circuits of the invention react similarly to any ESD event. The initial voltage spike and maximum voltage 311 at the 11 pin are shown. Additionally, the voltage at node 25 is shown. The depicted ESD event reaches maximum voltage (in this example about 4.5V) in less than about 40 ns. This is well in excess of the 50 mV/ns threshold devised for some embodiments of the invention. Such events can have slower or faster rise times and lower maximum voltages and still be extremely destructive. However, the inventor understands that a 50 mV/ns threshold is sufficient to deal with a wide range of ESD events.

Also depicted, curve 312 maps the voltage at node 25 which closely follows the pin voltage 311. As depicted, the voltage here slightly lags that of the pin 11 but also rises quickly in response to the ESD event. The voltage at node 25 serves as an input into inverter $I_1$. The inverter $I_1$ is set so that it "inverts" the signal at 25 when the voltage at node 25 passes a predefined threshold voltage value. Here, in this example, the inverter $I_1$ is set to flip at an input voltage (curve 312) of about 1.5V. Thus, when voltage at node 25 reaches 1.5V (see curve 312) the output 18 of the inverter $I_1$ switches and goes "low" (see curve 313). Accordingly, the pin 11 voltage peaks at about 4.5V low enough to prevent destruction of circuitry 16. These thresholds can be set at any desired level, but as indicated above, this is largely dictated by the needs of the internal circuitry to be protected 16. The point being that the inverter $I_1$ flips at a voltage that enables the circuit 10 to shunt the ESD energy away from the protected circuitry 16.

To recap, the pin voltage 11 (curve 311), node 25 voltage (curve 312), and the output of inverter $I_1$ (by curve 313) is shown. Thus, during an ESD event, the output 18 of inverter $I_1$ (curve 313) rises quickly with the ESD event at in 11 (curve 311) and is characterized by an extremely fast drop off at time 323 when the inverter $I_1$ goes low in response to the 1.5V input 25 which flips the state of the inverter $I_1$. Thus, the output 18 goes "high" as the ESD event begins. This turns "on" transistor $T_1$ briefly before the output 18 switches low at 323 which shuts $T_1$ "off". When $T_1$ is "on", node 27 goes "low" as shown by curve 314. Once the voltage at 27 goes "low" it stays "low" for an extended period of time (even after the input into $T_1$ returns to "low") due to the long RC time constant $\tau_2$ of the duration control circuitry 13. For example, voltage 27 rises initially during the ESD event (curve 314) but not high enough to flip inverter $I_2$ (set to flip at, for example, about 1.5 V) and then goes "low" when $T_1$ is turned on (e.g., curve 314, at time 323). Voltage at 27 stays low for an extended time period (e.g., 1 μs or other predetermined time period, usually greater than 500 ns). Additionally, as the ESD energy at the pin 11 is substantially dissipated (curve 311) and then the voltage at node 27 tracks voltage at pin 11 (curve 311) as it steadily declines during the post ESD event time period (here, for example, after about 1 μs as at 324). Node 27 operates as an input to inverter $I_2$ which drives the shunting transistor $T_d$ of dissipation circuitry 15. The inverter $I_2$ can be set such that any desired level is "low" but in this depicted example, low is less than 1.5V (See, curve 314). Because node 27 (curve 314) drops "low" and stays low for an extended time period of time, the input to inverter $I_2$ stays low for an extended period of time. Accordingly, the output 28 of inverter $I_2$ is "high" and is sustained at high for an extended period of time due to the long RC time constant $\tau_2$ of duration control circuit 13.

Figure 3B:
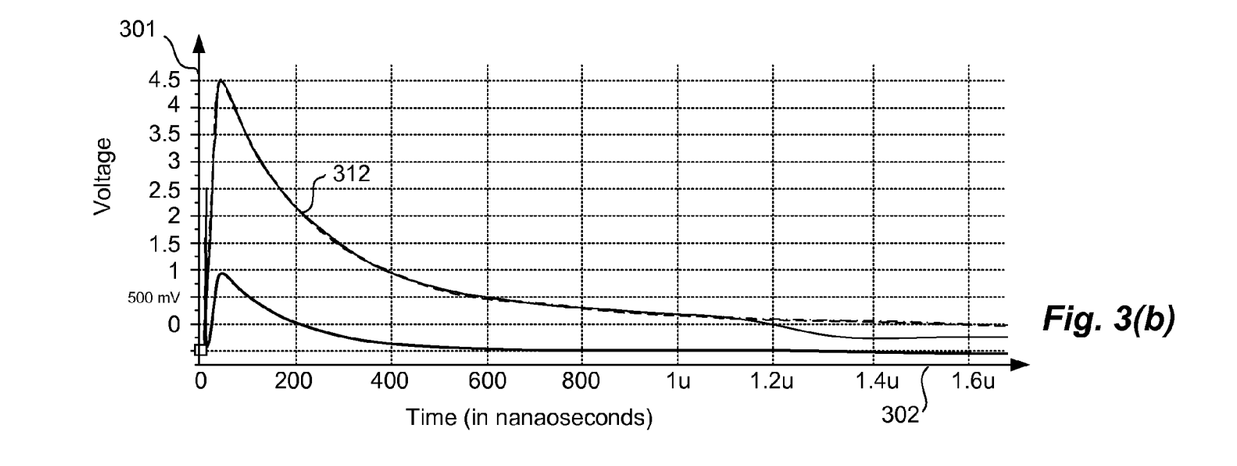

The extended "high" output 28 of inverter $I_2$ is shown with reference to FIG. 3(b). Curve 315 shows that output 28 follows the voltage at pin 11 (curve 311). This "high" is then input into the shunting transistor $T_d$ of dissipation circuit 15. The transistor $T_d$ is configured such that it remains on long enough to dissipate the ESD energy. Generally, effective dissipation can be achieved in as little as 500 ns although the circuitry can be set for longer periods. This is effectively determined by the $R_2C_2$ time constant $\tau_2$ of duration control circuitry 13. In a typical example, the "on" voltages for the transistor $T_d$ can be set such that it turns "on" when it receives a voltage of in the range of about 0.4-0.6V depending on the application, however, this is not critical.

This is to be contrasted with circuit behavior for non-ESD voltage events. In one such example, a standard ramp-up voltage at power on is described with reference to FIGS. 3(c) and FIG. 2(a).

Figure 3C:
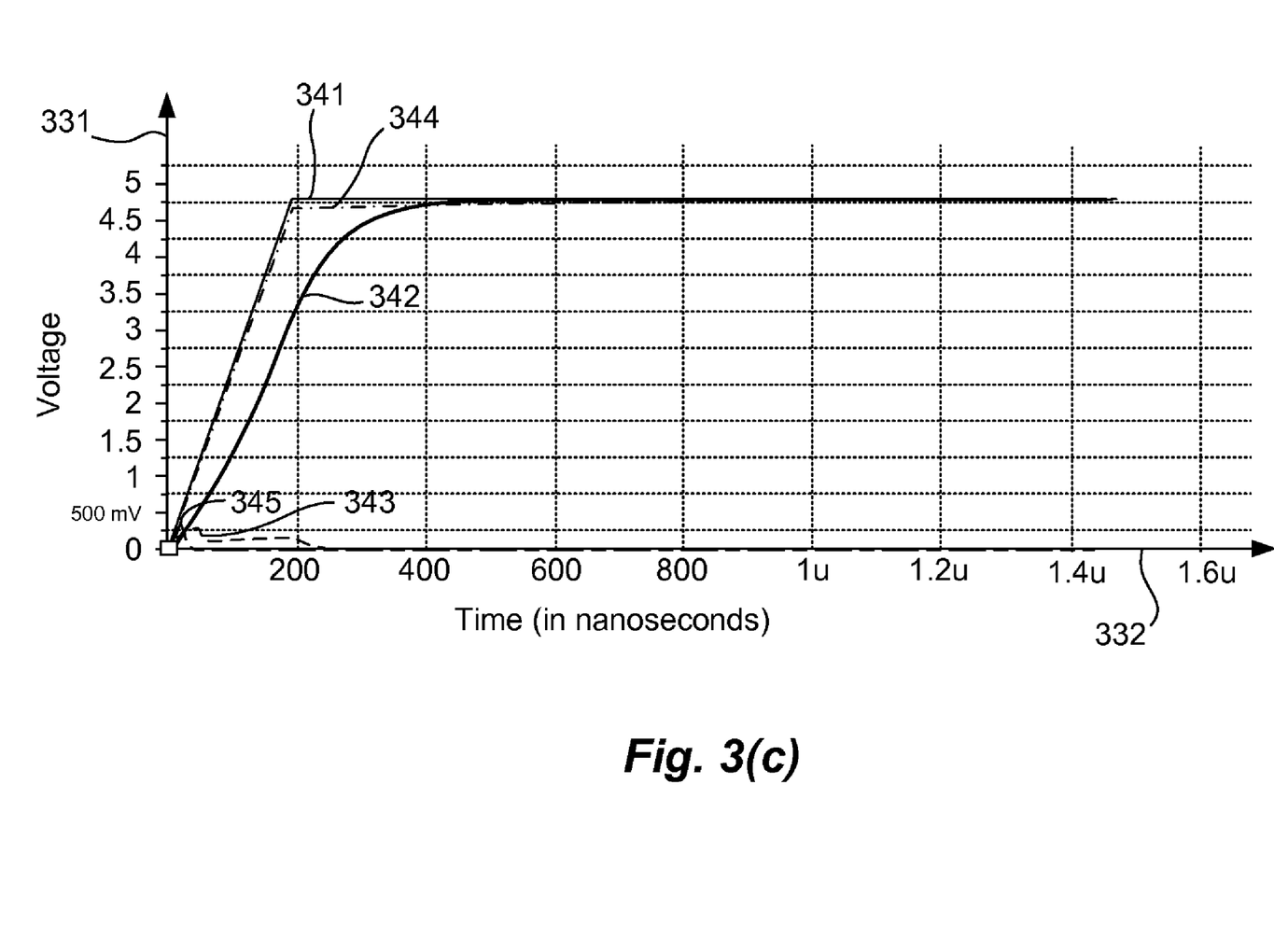

FIG. 3(c) is graph that maps voltage during a normal powered ramp up. The graph maps voltage as a function of time. In this depiction, the voltages are associated with a standard event. For example, the depicted ramp up is to 5V in about 100-105 ns. This provides a rise time at pin 11 of less than 50 mV/ns. Therefore, the slew rate of the ramp up voltage is less than the threshold (e.g., 50 mV/ns) set for the operation of the slew rate detector 21. It is important to point out that the slew rate threshold for detector 21 can be set at any desired level. It is commonly matched to the slew rate of the ordinary ramp up voltage of the given circuit. Thus, embodiments of the invention are very sensitive to slew rate and can be set with a slew rate threshold set at the desired level.

Returning to FIG. 3(c), the vertical axis 331 is demarcated in volts (V) and the horizontal axis 332 represents time (t) in nanoseconds (ns). The voltage at pin 11 is reflected by voltage curve 341. Additionally, the voltage at node 25 is shown (curve 342). The voltage at node 25 (342) tracks the pin 11 voltage (341) with a slight lag. Accordingly, voltages at 11 and at 25 go high at a relatively controlled rate and stay high. This is in contrast with the pin 11 during an ESD event where the voltage goes "high" very rapidly, but then drops off quickly. Thus, the slew rate dependency of 21 enables the circuit 12 to be selectively responsive to ESD events while not triggering for non-ESD events. Therefore, unlike during an ESD event, during ramp up the pin 11 and node 25 reach maximum voltage (in this circuit 5V) and then stays high. This voltage from node 25 (curve 342) is the input into $I_1$. Thus, the output of $I_1$ is driven low after a short rise period, as shown by curve 343. The slew rate threshold of 21 is set to enable a distinction between ESD and the depicted ramp-up voltage curve. Thus, as shown in curve 343, the output 18 of inverter $I_1$ rises a small amount (less than about 500 μV) and then drops. In either case, the voltage (curve 343) is insufficient to turn transistor $T_1$ on. Because, T1 stays "off" the voltage at node 27 follows the voltage at pin 11 defining curve 344. Thus, the voltage at node 27 is very similar to curve 341 of pin 11. Node 27 operates as an input to inverter $I_2$ which, in the case where latch 14 is omitted, provides output 28 which is directly input into the shunting transistor $T_d$ of dissipation circuitry 15. Thus, during ramp up, the input (curve 344) to inverter $I_2$ rises to high and stays high. As a consequence, the inverter $I_2$ produces output 28 which stays relatively low. This is shown by curve 345 which rises a small amount (less than 500 μV which does not flip the inverter $I_2$ to "high") and then drops thereby operating continuously at "low". In neither condition does this output 28 turn transistor $T_d$ on. Accordingly, the low at 28 keeps the transistor $T_d$ off and thus the voltage at pin 11 is the input into the internal circuitry 16 without being shunted to low rail 24.

The inventor describes a few added embodiments. For example, internal protective circuitry can be used to protect the inverters $I_1$, $I_2$ and their associated circuitry. In one approach, the rise time dependent activation circuitry 12 can include an optional protective circuit $P_1$ can be used to protect inverter $I_1$ from overload in the event the voltage at node 25 is too high. Once the voltage at node 25 exceeds the breakdown voltage for protective circuit $P_1$ the voltage is shunted down to the $V_{SS}$ line 24. In one example, protective circuit $P_1$ comprises one or more transistors configured so that the protective circuit $P_1$ has a breakdown voltage in the range of 7V or more. In one example, a protective circuit $P_1$ comprises a CMOS transistor having a breakdown voltage of 8V.

Additionally, the duration control circuitry 13 can include another optional protective circuit $P_2$ can be used to protect inverter $I_2$ from overload in the event the voltage at node 25 is too high. Once the voltage at node 25 exceeds the breakdown voltage for protective circuit $P_2$ the voltage is shunted down to the $V_{SS}$ line 24. Such protective circuits $P_1$ can comprise one or more transistors configured so that the protective circuit $P_1$ has a breakdown voltage in the range of 7V or more.

Figure 2B:
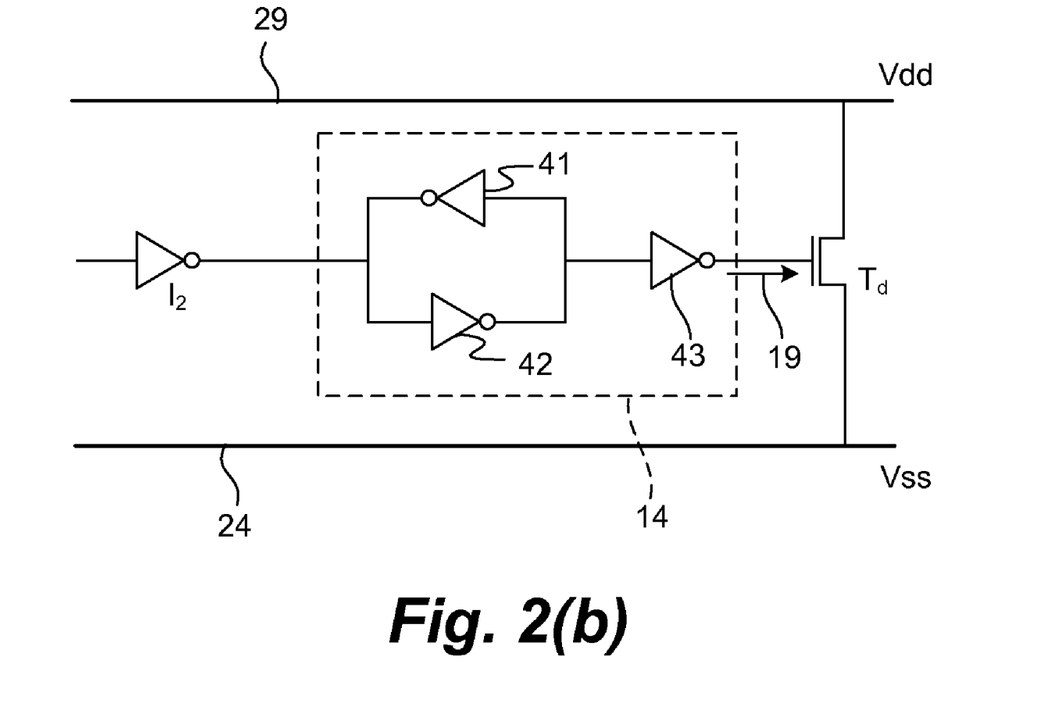
FIG. 2(b) is a detailed schematic depiction of an ESD protection circuit embodiment that includes latch circuitry.

Also, the inventors point out that dissipation duration circuitry 13 can be enhanced with optional the latch circuitry 14. Some embodiments of the invention the latch do not require the latch 14, but such latches can be used to provide highly useful implementations. The patentees point out that in the aforementioned embodiment described in FIG. 2(*a*) can be enhanced using a latch 14. In FIG. 2(*b*), an embodiment of the optional latch 14 is shown as incorporated into the circuit. In brief, the latch 14 is included to maintain stability under ordinary operating conditions. The latch is configured to maintain the latch output 19 at "low" thereby keeping the shunting transistor $T_d$ off during normal operation. This is particularly useful in "noisy" operating environments. In one example case, during normal operation, the internal circuitry from time to time draws power from the power line $V_{dd}$. This can cause a momentary drop in voltage at $V_{dd}$ which can mimic an ESD like events. The latch can provide stability by using an inverter 42 which has a high switching threshold. For example, the switching threshold can be 60-80% of $V_{dd}$. In the present example, for a 3V system, the switching threshold can be, for example, 2.0-2.2V. This means that voltage changes which may cause a change in the state of inverter $I_2$ causing it to momentarily go "high" (e.g., a small voltage variations or for a short periods of time) will not flip the inverter 42. Thus, it maintains its state (commonly high) until a sufficient voltage change event operates to change it. However, for a "real" ESD event, a large voltage is output 28 from $I_2$ (see curve 315 of FIG. 3(*b*)). This output is sufficient to flip the latch inverter 42 which is set with a rather high switch threshold (e.g., in the range of 2.0-2.5 volts). Thus, the inverter 42 will switch for genuine ESD events but not for transient fluctuations in power on rail 29 during ordinary operations.

In a typical embodiment, the ESD protection circuit operates the dissipation circuit 15 such that it remains operational to shunt the ESD energy for an amount of time sufficient to discharge the ESD event without damaging the internal circuitry 16. For example, the ESD protection circuit can be configured to discharge the ESD event down to a safety margin voltage of about 1.5 times the normal operating voltage of the internal circuitry 16. For example, for internal circuitry having a three volt (3V) normal operating voltage, the ESD protection circuit 10 operates to discharge the ESD voltage down to about 4.5V. In the case of an internal circuit having a 5V normal operating voltage, the ESD protection circuit 10 operates to discharge the ESD voltage down to about 7.5V. Of course, these are not hard and fast limitations but rather rough guidelines of the performance parameters of some embodiments. Thus, depending on the situation different discharge levels and rates of discharge will be required of the ESD protection circuit. In general, the ESD protection circuit 10 is configured to dissipate ESD energy in about 500 ns. However, such devices 10 can be configured to dissipate the energy in as little as 200 ns. However, in most cases the ESD protection circuit is configured to shunt the ESD energy to a safe level in a time range of about 500 ns to 2 μs (or even longer) depending on the precise configuration of the circuit 10 elements.

The applicants provide some representative values for the circuit elements of the ESD protective circuitry 10. For example the RC time constant for the rise time dependent activation circuitry is generally configured so that $\tau_1 = R_1 C_1$ is less than 40 nanoseconds. In addition, the ESD protection circuit 10 is configured so that $\tau_2 = R_2 C_2$ is greater than about 600 nanoseconds. In such an implementation, the ratio $\tau_2/\tau_1$ is greater than about 15. Of course the proffered figures pertain to just one of many possible implementations. In another common implementation $\tau_1$ can be in the range of 50-100 ns with $\tau_2 = R_2 C_2$ in the range of about 800-1200 nanoseconds. Longer $\tau_2$ enables longer dissipation times. Whereas shorter $\tau_1$ enables greater sensitivity to actual ESD events without excessive false triggering under normal operating conditions.

Figure 4:
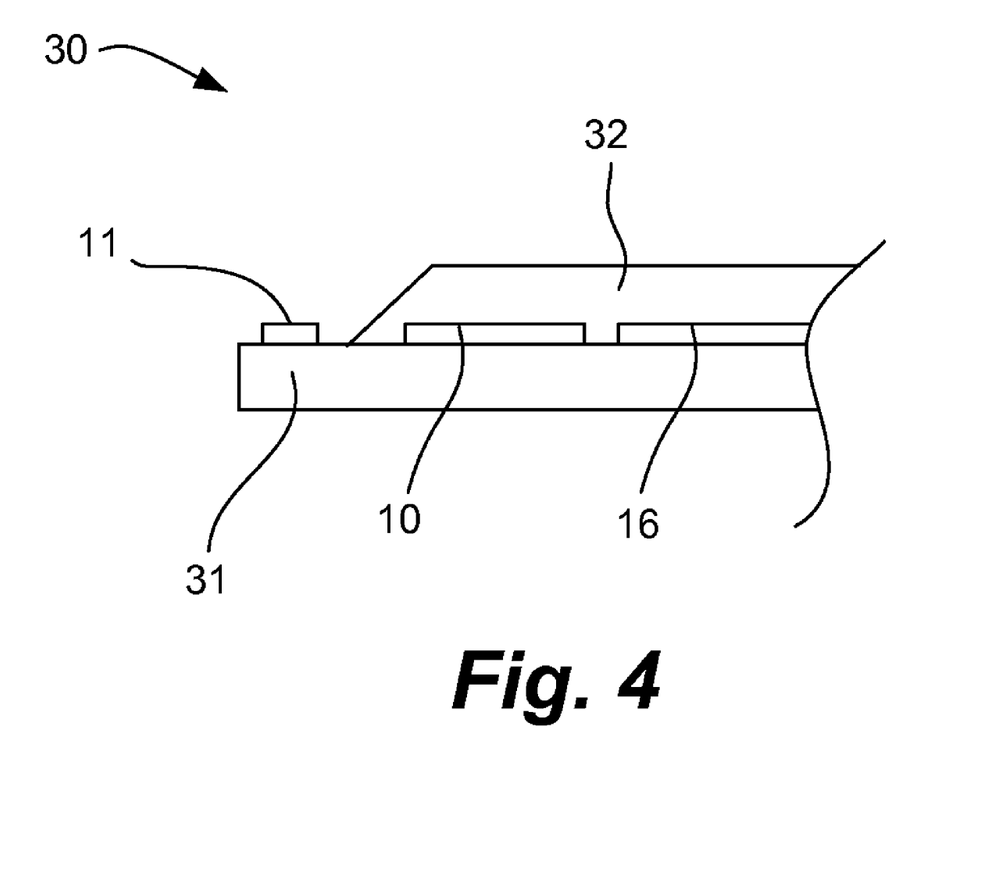
FIG. 4 is view of the ESD protection circuit formed on a semi-conductor package in accordance with the principles of the invention.

FIG. 4 provides a diagrammatic view of a semiconductor device package incorporating the ESD protection circuit of the present invention. The package 30 includes a substrate 31, upon which circuit elements are formed and connected using semiconductor processing and fabrication techniques known to those having ordinary skill in the art. The circuit elements can include an input pin 11 coupled with the ESD protection circuitry 10 and the internal circuitry. Commonly, the pin 11 is enhanced with a large capacitor arranged to absorb some of an ESD energy which is then transmitted to the circuitry 16 over a more extended time period. It is this voltage which is typically applied to pin 11. The device 30 is typically encapsulated 32 in a mold cap or other encapsulating structure.

Although the above examples provide a few embodiments of sample devices constructed in accordance with the principles of the invention they should in no way be interpreted as limiting the scope of the invention. As such many values and configuration can be constructed in accordance with the principles of the invention.

Figure 5:
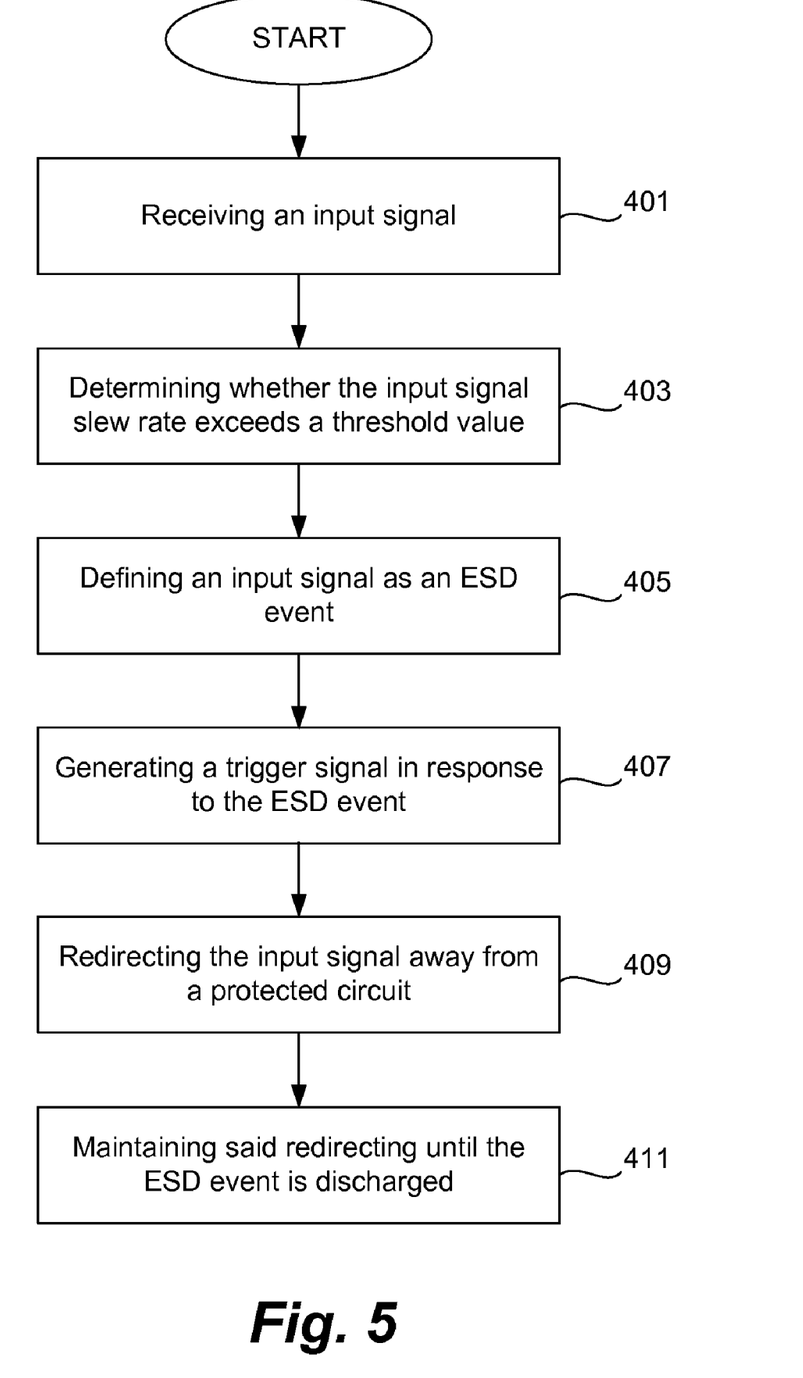
FIG. 5 is a flow diagram illustrating a mode of operation for one embodiment of the ESD protection circuitry described herein.

FIG. 5 describes a method embodiment for providing ESD protection to a protected circuit. The method comprises the following series of operations. An input signal is received at a circuit input (e.g., an input pin) (Operation 401) coupled to an ESD protection circuit and an internal circuit to be protected from ESD events. Such an input signal can be from a number of sources. It can be a standard input signal or an ESD event capable of damaging the internal circuit. A determination is made as to whether the input signal is an ESD event or some other event (Operation 403). Generally, input signals having a slew rate in excess of a predetermined threshold value are identified as ESD events. In one example, useful slew rate threshold values are those in the range of about 50-200 mV (millivolts) per nanosecond. In general, the threshold value is set at a slew rate in excess of the standard ramp up slew rate for the system in question. Once an input signal is identified as an ESD event (Operation 405) a trigger signal is generated (Operation 407). Such can be generated by the rise time dependent activation circuitry of some embodiments of the invention. Such a trigger signal can be a brief signal which dissipates rapidly in association with a short time RC time constant associated with a rise time dependent activation circuit. Thus, the trigger signal pulse on and off very quickly thereby avoiding false triggering. Responsive to the trigger signal, control circuitry is activated. The control circuitry activates shunting circuitry. Thus, the energy generated by the ESD event is redirected away from the protected circuitry preventing damage to the circuitry (Operation 409). The redirection can be to a ground or negative power line. Typically, this redirection can be accomplished by the ESD dissipation circuitry 15 of some embodiments of the invention. Additionally, the redirection is suitable as long as it routes the ESD event away from the protected circuitry. This circuitry 15 can be activated by embodiments of the ESD dissipation duration control circuitry. Additionally, the redirection is maintained for an extended period until sufficient energy has been discharged from the ESD event to prevent damage to the circuitry (Operation 411). For example, upon activation of the shunting circuitry the control circuitry maintains the shunt in operation for an extended period of time associated with an RC time constant of the control circuitry. Because the RC time constant of the control circuitry is much longer than the RC time constant of the of the trigger circuitry, the shunt remains in operation far longer than would be the case for the trigger circuitry alone. This extended period of time enables sufficient energy to be discharged through the shunting circuitry to protect the internal circuitry from damage.

An additional advantage of such inventive ESD protective circuitry is that it is more tolerant to process variation than prior art "snapback" ESD protection devices. Accordingly, its behavior is more predictable and the devices more manufacturable. Additionally, the inventive devices are smaller. Also, the inventive devices provide certain advantages when compared to so-called "active shunt networks" (aka "actively switched networks" or "rail-based networks"). As with snapback devices, process variations in such circuits can result in unpredictable response which can result in excess current or over-voltages that damage the protected circuitry. Also, the present ESD protection circuit does not require the extensive and time consuming test verification procedures required for most prior art protection circuitry. Also, the inventive circuitry is far less complicated to programmable ESD protection circuits. For these and other reasons, the presently described invention has many advantages over the state of the art.

Thus, the described invention overcomes the problems inherent in short RC time constant circuits (i.e., insufficient dissipation times) and also the problems inherent in long RC time constant circuits (i.e., false triggering of circuitry under normal operating conditions). It accomplishes this task using an extremely simple circuit and selected embodiments do not even require a latch to provide improved ESD performance.

The present invention has been particularly shown and described with respect to certain preferred embodiments and specific features thereof. However, it should be noted that the above-described embodiments are intended to describe the principles of the invention, not limit its scope. Therefore, as is readily apparent to those of ordinary skill in the art, various changes and modifications in form and detail may be made without departing from the spirit and scope of the invention as set forth in the appended claims. Other embodiments and variations to the depicted embodiments will be apparent to those skilled in the art and may be made without departing from the spirit and scope of the invention as defined in the following claims. For example, the rise time dependent activation circuitry and the ESD dissipation duration control circuitry are disclosed with respect to an ESD protection device. However, these circuits can be used with substantially any circuit requiring threshold detection and a sustained activation signal that extends beyond that enabled by the RC time constant of the activation circuitry. Further, reference in the claims to an element in the singular is not intended to mean "one and only one" unless explicitly stated, but rather, "one or more". Furthermore, the embodiments illustratively disclosed herein can be practiced without any element which is not specifically disclosed herein.

I claim:

1. An electrostatic discharge (ESD) protection circuit that protects an internal circuit having at least one input pin by dissipating energy associated with an ESD event at the input pin, the ESD protection circuit comprising:
    rise time dependent activation circuitry for detecting a slew rate of an input signal supplied at the input pin, wherein when activation circuitry determines that the slew rate of the input signal is greater than a first threshold value, then the input signal is the ESD event and generates a trigger signal of a short period of time in accordance with a first time constant associated with the circuitry of said activation circuitry and for input signals having a slew rate of less than the first threshold value, then no trigger signal is generated;
    dissipation duration control circuitry coupled to the rise time dependent activation circuitry and an ESD dissipation circuit, the duration control circuit is activated in response to the trigger signal received from the rise time dependent activation circuitry to produce an activation signal that activates the ESD dissipation circuitry and that controls the length of time the dissipation circuit remains active in accordance with a second time constant associated with the control circuitry that is longer than the first time constant causing the dissipation circuit to remain active long enough to enable sufficient discharge of the input signal the dissipation control circuitry further comprising a capacitor and transistor arranged in series between a voltage supplied at the input pin and a ground such that the gate and source of the transistor are connected with the ground, thereby forming a shunt protective circuit for protecting a shunt inverter; and
    the ESD dissipation circuitry coupled to the duration control circuitry, wherein the ESD dissipation circuitry responds to the activation signal provided by the duration control circuitry by activating the dissipation circuitry thereby shunting the energy associated with the ESD event away from the internal circuit, the ESD dissipation duration circuitry is configured to maintain the shunting of the energy for a period of time until a sufficient amount of the energy associated with the ESD event is shunted away from the internal circuit thereby protecting the internal circuit from the ESD event.

2. An electrostatic discharge (ESD) protection circuit as recited in claim 1 wherein the protection circuit is constructed without latch circuitry.

3. The ESD circuit of claim 1 wherein the first RC time constant of the rise time dependent activation circuitry is less than about 50 nanoseconds; and
    wherein the second RC time constant of the ESD dissipation duration control circuitry is greater than said first time constant.

4. The ESD circuit of claim 3 wherein the first RC time constant of the rise time dependent activation circuitry is less than about 40 nanoseconds; and
    wherein the second RC time constant of the ESD dissipation duration control circuitry is greater than about 400 nanoseconds.

5. The ESD circuit of claim 3 wherein the rise time dependent activation circuitry generates the trigger signal when the input signal slew rate exceed the first threshold value set at 50 millivolts per nanosecond.

6. The ESD circuit of claim 1 wherein the ESD dissipation duration control circuitry further includes latch circuitry to maintain the stability of the ESD circuit when subjected to noise sustained due to ordinary operating conditions.

7. The ESD protection circuit of claim 1 wherein the said ESD protection circuit is integrated into an integrated circuit package comprising:
    a substrate;
    the power pin, ESD protection circuit, and the internal circuit all arranged on the substrate;
    the power pin operatively coupled with internal circuitry of the device and coupled with the ESD protection circuit such that the ESD protection circuit is activated when an input signal applied to the input pin comprises an ESD event.

8. The ESD protection circuit of claim 7 wherein the power pin is further coupled to a capacitor which absorbs the initial ESD event and slowly dissipates the ESD energy into the ESD protection circuit.

9. An IC device comprising:
an input pin;
an internal circuit coupled with the input pin; and
an electrostatic discharge (ESD) circuit operatively coupled with the input pin and the internal circuit and arranged to protect the internal circuit from excessive voltage spikes, the ESD circuit comprising:
trigger circuitry, shunt duration circuitry, and shunt circuitry,
the trigger circuitry having a small first RC time constant that enables the trigger circuitry to produce a trigger signal that activates shunt duration circuitry when an input signal at the pin exceeds a first threshold value for slew rate;
the shunt duration circuitry arranged to produce an activation signal when the duration circuitry is activated by the trigger signal when the input signal exceeds the first threshold value for slew rate,
the shunt circuitry arranged to receive the activation signal and redirect the input signal away from the internal circuitry while receiving the activation signal; and
wherein the shunt duration circuitry has a larger second RC time constant configured to maintain the shunt duration circuitry in an activated condition beyond that specified by the first RC time constant of the trigger circuitry thereby enabling the duration circuitry to maintain the shunt circuitry active for a period of time sufficient to discharge an ESD event to an extent that it will not damage the internal circuitry the shunt duration circuitry further comprising a capacitor and transistor arranged in series between a voltage supplied at the input pin and arranged such that the gate and source of the transistor are connected with a ground forming a shunt protective circuit for protecting a shunt inverter of the shunt duration circuitry.

10. The IC device of claim 9 wherein the shunt duration circuitry includes latch circuitry configured to increase the stability of the ESD circuitry when subjected to the noise of ordinary operating conditions.

11. The IC device of claim 9 wherein the trigger circuitry is configured to activate the shunt duration circuitry when an electrostatic discharge event occurs at the power input pin but not activated when the input signal is an intended input signal.

12. The IC device of claim 11 wherein the intended signal is an inrush of voltage at power up.

13. An electrostatic discharge (ESD) protection circuit comprising:
a first RC circuit associated with a first RC time constant connected to a first voltage rail to produce a first RC based triggering signal in response to an electrostatic discharge on the first rail;
a shunt circuit configured to shunt ESD energy away from a protected circuit when activated in response to an electrostatic discharge event; and
a second RC circuit to produce a second RC based activation signal, said circuit coupled with the first RC circuit and the shunt circuitry and configured so that the circuit operates as a duration control circuit that produces the second RC based activation signal in response to the triggering signal received from the first RC circuit, said activation signal activating the shunt circuit and maintaining the shunt active for an extended period of time associated with a second RC time constant associated with the second RC circuit, wherein the second RC time constant is substantially longer than the first RC time constant thereby enabling the second RC circuit to maintain the activation signal long enough to safely discharge the energy of the electrostatic discharge
the second RC circuit further comprising a capacitor and transistor arranged in series between the first rail and a ground, the transistor arranged as a an inverter protection circuit arranged protect an inverter associated with the shunt before inverter breakdown voltage is reached at the inverter.

14. An electrostatic discharge (ESD) protection circuit of claim 13 configured so that it does not include latch circuitry.

* * * * *